(12) United States Patent
Tokuda et al.

(10) Patent No.: US 8,882,911 B2
(45) Date of Patent: Nov. 11, 2014

(54) APPARATUS FOR MANUFACTURING SILICON CARBIDE SINGLE CRYSTAL

(75) Inventors: Yuuichirou Tokuda, Nisshin (JP); Kazukuni Hara, Kasugai (JP); Jun Kojima, Iwakura (JP)

(73) Assignee: DENSO CORPORATION, Kariya (JP)

( * ) Notice: Subject to any disclaimer, the term of this patent is extended or adjusted under 35 U.S.C. 154(b) by 309 days.

(21) Appl. No.: 13/325,259

(22) Filed: Dec. 14, 2011

(65) Prior Publication Data

US 2012/0152166 A1 Jun. 21, 2012

(30) Foreign Application Priority Data

Dec. 16, 2010 (JP) ................. 2010-280308

(51) Int. Cl.
  C30B 21/02 (2006.01)
  C30B 25/16 (2006.01)
  C30B 25/14 (2006.01)
  C30B 29/36 (2006.01)

(52) U.S. Cl.
  CPC ............... C30B 29/36 (2013.01); C30B 25/165 (2013.01); C30B 25/14 (2013.01)
  USPC ............ 117/202; 117/200; 117/105; 117/109

(58) Field of Classification Search
  USPC .................. 117/200, 202, 105, 109
  See application file for complete search history.

(56) References Cited

U.S. PATENT DOCUMENTS

| 5,704,985 | A | 1/1998 | Kordina et al. |
| 6,299,683 | B1 | 10/2001 | Rupp et al. |
| 7,361,222 | B2 | 4/2008 | Janzén et al. |
| 2002/0056412 | A1 | 5/2002 | Hara et al. |
| 2005/0000406 | A1* | 1/2005 | Janzen et al. ............... 117/81 |
| 2006/0283389 | A1* | 12/2006 | Valente et al. ............. 118/715 |
| 2008/0022923 | A1 | 1/2008 | Kordina et al. |
| 2008/0149020 | A1 | 6/2008 | Janzen et al. |

FOREIGN PATENT DOCUMENTS

| JP | A-11-268990 | 10/1999 |
| JP | A-2002-362998 | 12/2002 |
| JP | A-2003-2795 | 1/2003 |
| JP | B2-3419144 | 4/2003 |
| JP | 2004-323351 A | 11/2004 |
| JP | 2006-527157 A | 11/2006 |
| JP | B2-3922074 | 3/2007 |
| JP | A-2007-326743 | 12/2007 |

OTHER PUBLICATIONS

Search Report dated Oct. 18, 2013 in the corresponding EP application No. 11192939.4.
U.S. Appl. No. 13/325,233, filed Dec. 14, 2011, Hara et al.

(Continued)

*Primary Examiner* — Bob M Kunemund
(74) *Attorney, Agent, or Firm* — Posz Law Group, PLC

(57) ABSTRACT

An apparatus for manufacturing a silicon carbide single crystal grows the silicon carbide single crystal on a seed crystal by supplying a material gas from below the seed crystal. The apparatus includes a heating container and a base located in the heating container. The seed crystal is mounded on the base. The apparatus further includes a first inlet for causing a purge gas to flow along an inner wall surface of the heating container, a purge gas source for supplying the purge gas to the first inlet, a second inlet for causing the purge gas to flow along an outer wall surface of the base, and a mechanism for supporting the base and for supplying the purge gas to the base from below the base.

15 Claims, 10 Drawing Sheets

(56) References Cited

OTHER PUBLICATIONS

Office Action mailed Oct. 23, 2012 in corresponding JP Application No. 2010-280308 (and English translation).

Office Action dated Dec. 31, 2013 issued in corresponding KR patent application No. 10-2011-0134714 (and English translation).
Office Action dated Mar. 26, 2014 issued in corresponding CN patent application No. 201110431762.3 (and English translation).

* cited by examiner

)# APPARATUS FOR MANUFACTURING SILICON CARBIDE SINGLE CRYSTAL

CROSS REFERENCE TO RELATED APPLICATION

This application is based on and claims priority to Japanese Patent Application No. 2010-280308 filed on Dec. 16, 2010.

FIELD

The present invention relates to an apparatus for manufacturing a silicon carbide (SiC) single crystal.

BACKGROUND

Silicon carbide (SiC) is expected to be used as a semiconductor material for a power device because of its high electron mobility and high breakdown voltage. Typically, a sublimation method (i.e., modified Lely Method) and a chemical vapor deposition (CVD) method are known as a method for manufacturing a SiC single crystal, which is used for a substrate of the power device. In the modified Lely Method, a SiC material is inserted in a graphite crucible, and a seed crystal (i.e., substrate crystal) is placed on an inner wall of the crucible in such a manner that the seed crystal and the SiC material can face each other. Then, the SiC material is heated to a temperature of from 2200° C. to 2400° C. to generate a sublimation gas, and the submission gas is recrystallized on the seed crystal that is lower in temperature than the SiC material by tens to hundreds of degrees Celsius. Thus, a SiC single crystal is grown on the seed crystal.

According to the modified Lely Method, the SiC material decreases with growth of the SiC single crystal. Therefore, the growth of the SiC single crystal is limited to a predetermined amount that depends on the amount of the SiC material. The growth of the SiC single crystal may be increased by adding additional SiC material. However, in this case, a Si/C ratio exceeds one during sublimation of SiC. Therefore, the addition of the SiC material causes the sublimation gas concentration and the sublimation rate in the crucible to vary. As a result, the quality of the SiC single crystal is reduced.

U.S. Pat. No. 5,704,985 corresponding to JP-11-508531A discloses a method for epitaxially growing SiC by the CVD method. In the CVD method, a seed crystal is placed in a cylindrical reactive pipe (i.e., susceptor), and a material gas containing Si and C is supplied to grow a SiC single crystal on the seed crystal. The CVD method can successively supply the reaction gas so that the SiC single crystal can be grown for a long time.

However, according to the CVD method, a SiC crystal is deposited and grown on not only the seed crystal but also on unwanted portions such as an inner surface of the reactive pipe and a material gas outlet. Due to the growth of the SiC crystal on the unwanted portions, the supply of the material gas cannot be continued. As a result, the growth of the SiC single crystal on the seed crystal is stopped.

In US 2008/0022923, a hole is formed in the crucible, and a deposition prevention gas is introduced through the hole to prevent clogging of the material gas outlet. However, the deposition prevention gas may prevent the deposition only near the hole.

SUMMARY

In view of the above, it is an object of the present invention to provide an apparatus for growing a SiC single crystal for a long time by reducing or preventing deposition of a SiC polycrystal on an unwanted portion.

According to an aspect of the present invention, an apparatus for manufacturing a silicon carbide single crystal grows the silicon carbide single crystal on a surface of a seed crystal made from a silicon carbide single crystal substrate by supplying a material gas for silicon carbide from below the seed crystal. The apparatus includes a cylindrical tube-shaped heating container, a base, a first purge gas inlet, a purge gas source, a second purge gas inlet, and a purge gas introduction mechanism. The heating container has an inner wall surface defining a reaction chamber. The base is located in the reaction chamber of the heating container and having a first side and a second side opposite to the first side. The seed crystal is mounded on the first side of the base. The first purge gas inlet is provided to the inner wall surface of the heating container to cause a purge gas to flow along the inner wall surface of the heating container. The purge gas source supplies the purge gas to the first purge gas inlet. The second purge gas inlet is provided to an outer wall surface of the base to cause the purge gas to flow along the outer wall surface of the base. The purge gas introduction mechanism supports the base and supplies the purge gas to the base from the second side of the base.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

First Embodiment

Figure 1:
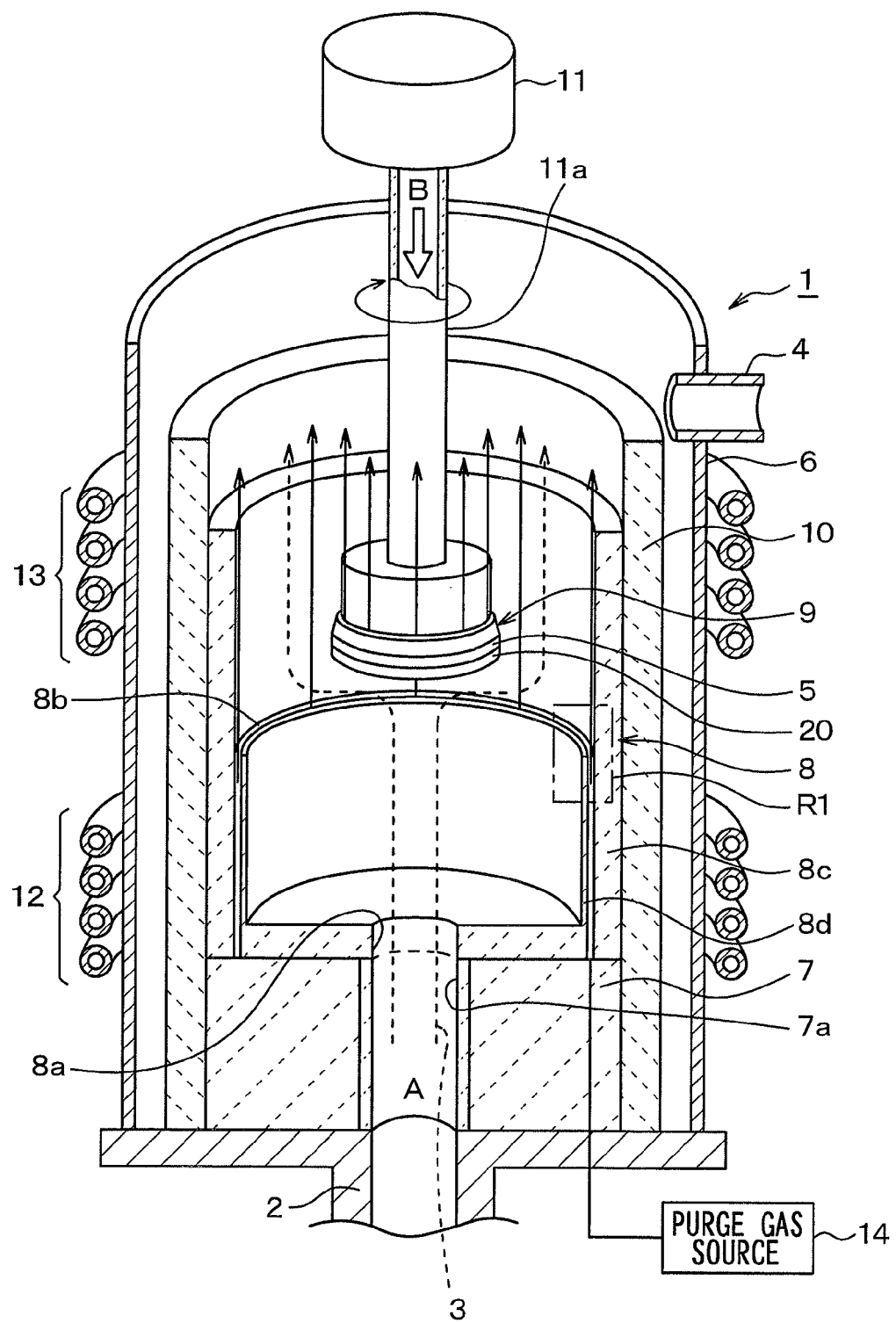
FIG. 1 is a diagram illustrating a perspective cross-sectional view of a SiC single crystal manufacturing apparatus according to a first embodiment of the present invention.

A SiC single crystal manufacturing apparatus 1 according to a first embodiment of the present invention is described below with reference to FIG. 1.

The manufacturing apparatus 1 has a material gas inlet port 2 and a material gas outlet port 4. The material gas inlet port 2 is located at a bottom of the manufacturing apparatus 1, and the material gas outlet port 4 is located at an upper part of the manufacturing apparatus 1. A seed crystal 5 made from a SiC single crystal substrate is placed in the manufacturing apparatus 1, and a carrier gas and a material gas 3 for SiC are introduced into the manufacturing apparatus 1 through the material gas inlet port 2 and discharged from the manufacturing apparatus 1 through the material gas outlet port 4 so that a SiC single crystal 20 can be grown on the seed crystal 5. The material gas 3 contains both Si and C. For example, the material gas 3 can be a gas mixture of a silane-based gas (e.g., silane) and a hydrocarbon-based gas (e.g., propane).

The manufacturing apparatus 1 includes a vacuum container 6, a first heat insulator 7, a heating container 8, a base 9, a second heat insulator 10, a purge gas introduction mechanism 11, a first heating device 12, and a second heating device 13.

For example, the vacuum container 6 is made of quartz glass and has a cylindrical tube shape. The material gas inlet port 2 is located at a bottom of the vacuum container 6, and the material gas outlet port 4 is located at the upper part (e.g., upper part of a side wall) of the vacuum container 6. The carrier gas and the material gas 3 are introduced into an inner space of the vacuum container 6 through the material gas inlet port 2 and discharged from the inner space of the vacuum container 6 through the material gas outlet port 4. The vacuum container 6 is configured such that pressure in the inner space can be reduced by vacuuming the inner space. Some components of the manufacturing apparatus 1 are accommodated in the inner space of the vacuum container 6.

The first heat insulator 7 has a cylindrical tube shape and defines a material gas introduction pipe 7a. The first heat insulator 7 is coaxially arranged with the vacuum container 6. For example, the first heat insulator 7 can be made of graphite. In this case, a surface of the first heat insulator 7 can be coated with a refractory (i.e., high-melting point) metal carbide such as tantalum carbide (TaC) or niobium carbide (NbC) to reduce or prevent thermal etching of the first heat insulator 7.

The heating container 8 defines a reaction chamber in which the SiC single crystal 20 is grown on a surface of the seed crystal 5. For example, the heating container 8 can be made of graphite. In this case, a surface of the heating container 8 can be coated with a refractory metal carbide such as tantalum carbide (TaC) or niobium carbide (NbC) to reduce or prevent thermal etching of the heating container 8. The heating container 8 extends from the upstream side of the base 9 to the downstream side of the base 9 in a flow direction of the material gas 3 so that the base 9 can be surrounded by the heating container 8. Thus, the heating container 8 removes particles contained in the material gas 3 introduced from the material gas inlet port 2 and decomposes the material gas 3, before the material gas 3 reaches the seed crystal 5.

Specifically, the heating container 8 has a cylindrical tube shape. According to the first embodiment, the heating container 8 has a bottom with a material gas introduction port 8a. The gas introduction port 8a communicates with the gas introduction pipe 7a of the first heat insulator 7 so that the material gas 3 flowing through the gas introduction pipe 7a can be introduced into the heating container 8 through the gas introduction port 8a.

A first purge gas inlet 8b is provided to an inner wall surface of the heating container 8. The first purge gas inlet 8b is located on the upstream side of the base 9 in the flow direction of the material gas 3. For example, the purge gas can be an inert gas such as Ar or He, an etching gas such as $H_2$ or HCl, or a mixture gas of the inert gas and the etching gas. The purge gas serves as a gas for reducing or preventing an adhesion of a SiC polycrystal. The first purge gas inlet 8b extends along the entire inner circumference of the heating container 8 so that the purge gas introduced through the first purge gas inlet 8b can surround the base 9. In other words, the first purge gas inlet 8b extends circularly along the inner wall surface of the heating container 8 in a circumferential direction of the heating container 8.

Figure 2:
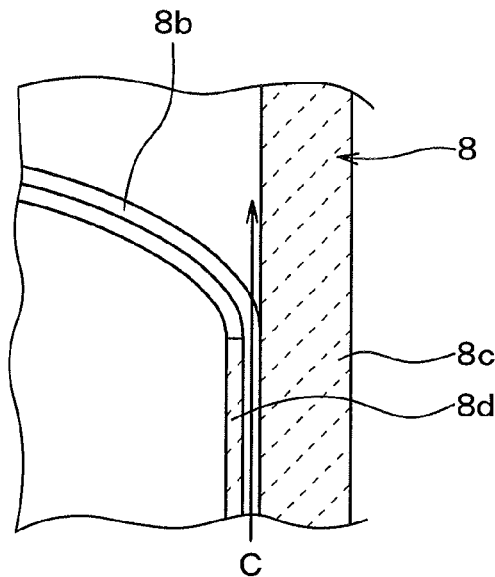
FIG. 2 is a diagram illustrating an enlarged view of a region R1 in FIG. 1.

FIG. 2 is a diagram illustrating an enlarged view of a region R1 in FIG. 1. As shown in FIG. 2, the heating container 8 has a first cylindrical tube 8c and a second cylindrical tube 8d. The first cylindrical tube 8c has open ends. In contrast, the second cylindrical tube 8d has one open end and one closed end. That is, the second cylindrical tube 8d has a bottom. The second cylindrical tube 8d is located inside the first cylindrical tube 8c and spaced from the first cylindrical tube 8c so that a clearance can be formed between the first cylindrical tube 8c and the second cylindrical tube 8d. The first cylindrical tube 8c defines an outer wall surface of the heating container 8, and the second cylindrical tube 8d defines an inner wall surface and a bottom of the heating container 8. The clearance between the first cylindrical tube 8c and the second cylindrical tube 8d defines the first purge gas inlet 8b. The first purge gas inlet 8b is connected to an external purge gas source 14 through a communication hole (not shown) formed in the first heat insulator 7. Thus, the purge gas supplied from the purge gas source 14 is discharged in the heating container 8 from the entire inner circumference of the heating container 8 through the first purge gas inlet 8b.

In this case, an outer wall surface of the second cylindrical tube 8d serves as a ring-shaped guide portion for determining a discharge direction in which the purge gas is discharged in the heating container 8 through the first purge gas inlet 8b. According to the first embodiment, the first cylindrical tube 8c and the second cylindrical tube 8d are coaxially arranged so that an inner wall surface of the first cylindrical tube 8c can be parallel to and spaced from the outer wall surface of the second cylindrical tube 8d by a predetermined constant distance. Thus, the discharge direction extends along the inner wall surface of the first cylindrical tube 8c so that the purge gas discharged through the first purge gas inlet 8b can flow along the inner wall surface of the first cylindrical tube 8c.

The base 9 has a circular plate shape like a disk and is coaxially arranged with the heating container 8. For example, the base 9 can be made of graphite. In this case, a surface of the base 9 can be coated with a refractory metal carbide such as tantalum carbide (TaC) or niobium carbide (NbC) to reduce or prevent thermal etching of the base 9. The seed crystal 5 is mounted on the base 9, and the SiC single crystal 20 is grown on the surface of the seed crystal 5. The base 9 is described in detail below with reference to FIG. 3.

Figure 3:
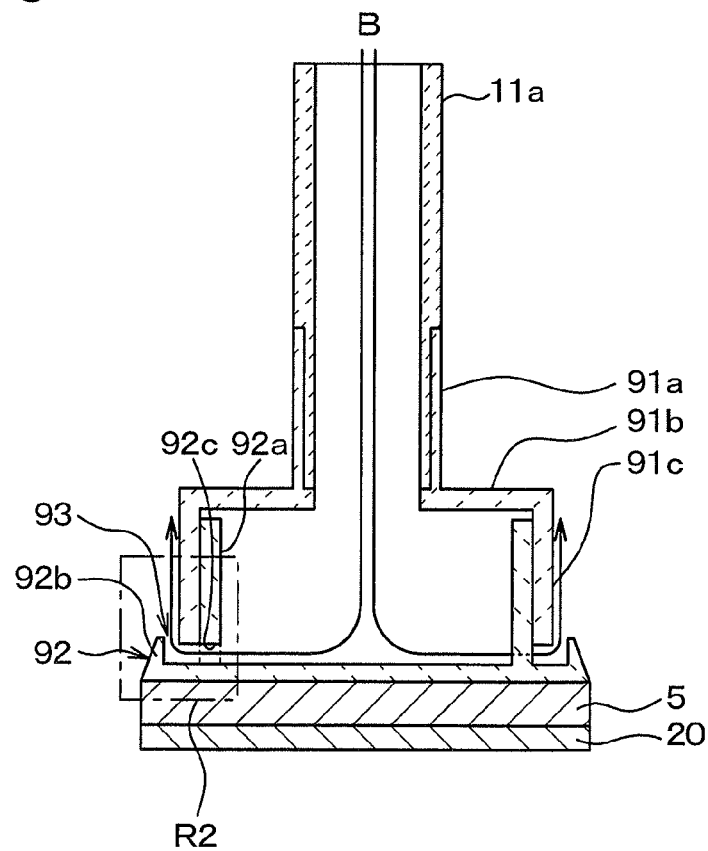
FIG. 3 is a diagram illustrating a partial enlarged view of FIG. 1, showing a base of the SiC single crystal manufacturing apparatus.

As shown in FIG. 3, the base 9 includes a coupling portion 91 and a mounting portion 92. The coupling portion 91 is coupled to the purge gas introduction mechanism 11. The seed crystal 5 is mounted on the mounting portion 92. The coupling portion 91 and the mounting portion 92 define a second purge gas inlet 93.

The coupling portion 91 has a first cylindrical tube 91a, a flange 91b, and a second cylindrical tube 91c. The first cylindrical tube 91a is coupled to a tip of a pipe member 11a of the purge gas introduction mechanism 11. The flange 91b extends from an end of the first cylindrical tube 91a, opposite to an end coupled to the pipe member 11a, in a radial outward direction of the first cylindrical tube 91a. The second cylindrical tube 91c is formed on an outer region of a surface of the flange 91b, opposite to a surface where the first cylindrical tube 91a is formed. An inner diameter of the second cylindrical tube 91c is larger than an inner diameter of the first cylindrical tube 91a.

The mounting portion 92 has a cylindrical tube portion 92a. A first end of the cylindrical tube portion 92a is opened. In contrast, a second end of the tube portion 92a is closed. That is, the cylindrical tube portion 92a has a bottom. The second cylindrical tube 91c of the coupling portion 91 is fitted into the first end of the cylindrical tube portion 92a. An adhesive is applied between the first end of the cylindrical tube portion 92a and the second cylindrical tube 91c so that the coupling portion 91 and the mounting portion 92 can be fixed together. The seed crystal 5 is mounted on an outer surface of the bottom of the cylindrical tube portion 92a. The outer surface of the bottom of the cylindrical tube portion 92a is flat. The outer surface of the bottom of the cylindrical tube portion 92a is hereinafter called the "mounting surface".

An outer diameter of the bottom of the cylindrical tube portion 92a is larger than an outer diameter of a tube part of the cylindrical tube portion 92a so that the bottom of the cylindrical tube portion 92a can have a flange portion. A ring-shaped guide portion 92b is formed on an outer edge of the flange portion. The guide portion 92b projects from a surface of the flange portion, opposite to the mounting surface, in a direction opposite to a direction in which the SiC single crystal 20 is grown. An inner wall surface of the guide portion 92b is perpendicular to the mounting surface and coaxially arranged with the cylindrical tube portion 92a. Further, the inner wall surface of the guide portion 92b is located facing an outer wall surface of the second cylindrical tube 91c so that a clearance can be formed between the inner wall surface of the guide portion 92b and the outer wall surface of the second cylindrical tube 91c. The clearance between the inner wall surface of the guide portion 92b and the outer wall surface of the second cylindrical tube 91c define the second purge gas inlet 93.

Figure 4:
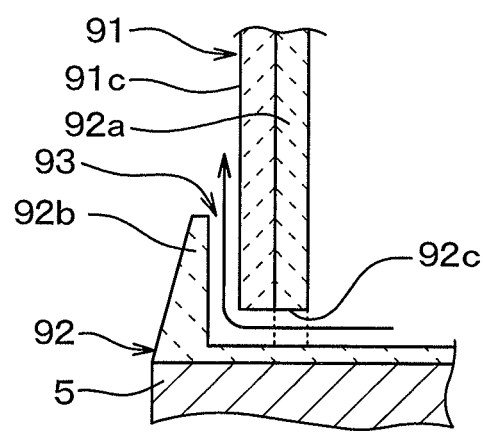
FIG. 4 is a diagram illustrating an enlarged view of a region R2 in FIG. 3.

In contrast, an outer diameter of the guide portion 92b is reduced in the flow direction of the material gas 3. Specifically, an outer wall surface of the guide portion 92b is tapered so that the outer diameter of the guide portion 92b can be smaller on the downstream side than on the upstream side in the flow direction the material gas 3. The outer wall surface of the guide portion 92b is inclined with respect to the mounting surface. FIG. 4 is a diagram illustrating an enlarged view of a region R2 in FIG. 3. As shown in FIGS. 3 and 4, the outer wall surface of the guide portion 92b is tapered so that the outer diameter of the guide portion 92b can be reduced in the flow direction the material gas 3. The tapered outer wall surface of the guide portion 92b reduces or prevents contact between the material gas 3 and the outer wall surface of the guide portion 92b. Thus, it is possible to reduce or prevent adhesion of a polycrystal on the outer wall surface of the guide portion 92b.

Further, communication holes 92c are formed in the cylindrical tube portion 92a. The communication holes 92c are located closer to the bottom of the cylindrical tube portion 92a than a tip of the guide portion 92b. The communication holes 92c are arranged at a regular interval in a circumferential direction of the cylindrical tube portion 92a.

In the base 9, the seed crystal 5 is mounted on the mounting surface, and the SiC single crystal 20 is grown on the surface of the seed crystal 5. During the growth of the SiC single crystal 20, the purge gas, which is introduced from the purge gas introduction mechanism 11, is led to the second purge gas inlet 93 through an inner space of the coupling portion 91, an inner space of the cylindrical tube portion 92a, and the communication holes 92c. Then, the purge gas is discharged toward the outer edge of the base 9 through the second purge gas inlet 93.

In the base 9, the outer wall surface of the second cylindrical tube 91c and the guide portion 92b serves as a guide portion for determining a discharge direction in which the purge gas is discharged in the heating container 8 through the second purge gas inlet 93. According to the first embodiment, the second cylindrical tube 91c and the guide portion 92b are coaxially arranged so that the outer wall surface of the second cylindrical tube 91c can be parallel to the inner wall surface of the guide portion 92b. Thus, the discharge direction extends along the outer wall surface of the second cylindrical tube 91c so that the purge gas discharged through the second purge gas inlet 93 can flow along the outer wall surface of the second cylindrical tube 91c.

Referring back to FIG. 1, the second heat insulator 10 surrounds the heating container 8 and the base 9 to lead the remainder of the material gas 3 introduced to the base 9 toward the material gas outlet port 4. Specifically, the second heat insulator 10 is configured so that the remainder of the material gas 3 supplied to the seed crystal 5 can flow to the material gas outlet port 4 through a clearance between the base 9 and the second heat insulator 10.

The purge gas introduction mechanism 11 is configured to rotate and lift the pipe member 11a. Specifically, a first end of the pipe member 11a is connected to a surface of the base 9, opposite to the mounting surface where the seed crystal 5 is mounted. A second end of the pipe member 11a is connected to the purge gas introduction mechanism 11. Thus, the purge gas introduction mechanism 11 can rotate and lift the pipe member 11a along with the base 9, the seed crystal 5, and the SiC single crystal 20. Thus, the purge gas introduction mechanism 11 can keep a growth face of the SiC single crystal 20 at a temperature suitable for growth of the SiC single crystal 20 by rotating and lifting the pipe member 11a according to the growth of the SiC single crystal 20. For example, the pipe member 11a can be made of graphite. In this case, a surface of the pipe member 11a can be coated with a refractory metal carbide such as tantalum carbide (TaC) or niobium carbide (NbC) to reduce or prevent thermal etching of the pipe member 11a.

Further, the purge gas introduction mechanism 11 introduces the purge gas into the pipe member 11a to supply the purge gas to the base 9 from the back side of the base 9. For example, the purge gas can be an inert gas (e.g., Ar, He), an etching gas (e.g., $H_2$, HCl), or a mixture gas of the inert gas and the etching gas. The purge gas that is supplied from the purge gas introduction mechanism 11 to the base 9 is discharged toward the outer edge of the base 9.

Each of the first heating device 12 and the second heating device 13 surrounds the vacuum container 6. For example, each of the first heating device 12 and the second heating device 13 can include a heat-generating induction coil, a heater, or the like. The first heating device 12 is located at a position corresponding to a lower part of the heating container 8, and the second heating device 13 is located at a position corresponding to the base 9. The first heating device 12 and the second heating device 13 are independently controlled so that the growth face of the SiC single crystal 20 can be adjusted to the temperature suitable for the growth of the SiC single crystal 20.

Next, a method for manufacturing the SiC single crystal 20 using the manufacturing apparatus 1 according to the first embodiment is described below.

Firstly, the seed crystal 5 is mounted on the base 9. Then, the first heating device 12 and the second heating device 13 are controlled to generate a predetermined temperature distribution in the heating container 8. The predetermined temperature distribution is set so that the material gas 3 can be recrystallized at a surface of the seed crystal 5 to grow the SiC single crystal 20. Further, the predetermined temperature distribution is set so that the recrystallization rate can be less than a sublimation rate in the heating container 8.

Then, the vacuum container 6 is kept at a predetermined pressure, and the material gas 3 is introduced into the vacuum container 6 through the gas introduction pipe 7a. If necessary, a carrier gas (e.g., inert gas such as Ar, He) or an etching gas (e.g., $H_2$, HCl) can be introduced along with the material gas 3. Thus, as indicated by an arrow A in FIG. 1, the material gas 3 is supplied to the seed crystal 5 so that the SiC single crystal 20 can be grown on the seed crystal 5.

At this time, the purge gas introduction mechanism 11 and the purge gas source 14 introduces the purge gas through the pipe member 11a and the first purge gas inlet 8b. Thus, as indicated by an arrow B in FIGS. 1 and 3, the purge gas is supplied from the pipe member 11a to the outer edge of the base 9 through a purge gas introduction path of the base 9. Then, the purge gas supplied from the pipe member 11a is discharged from the base 9 through the second purge gas inlet 93 in the same direction as the flow direction of the material gas 3 so that the purge gas discharged through the second purge gas inlet 93 can flow along the outer wall surface of the base 9 (i.e., the second cylindrical tube 91c). Further, as indicated by an arrow C in FIG. 2, the purge gas introduced from the purge gas source 14 is discharged through the first purge gas inlet 8b of the heating container 8 in the same direction as the flow direction of the material gas 3 so that the purge gas discharged through the first purge gas inlet 8b can flow along the inner wall surface of the heating container 8 (i.e., the first cylindrical tube 8c) to surround the base 9.

Such a flow of the purge gas reduces or prevents formation of a polycrystal on a portion around the base 9 and on the inner surface of the heating container 8. Thus, the formation of the polycrystal on a portion around the seed crystal 5 is reduced or prevented, and clogging of a flow path of the material gas 3 due to the formation of the polycrystal can be avoided. Therefore, it is possible to grow the SiC single crystal 20 for a long time.

In particular, according to the first embodiment, the inner wall surface of the first cylindrical tube 8c is parallel to the outer wall surface of the second cylindrical tube 8d, and the outer wall surface of the second cylindrical tube 91c is parallel to the inner wall surface of the guide portion 92b. In such an approach, the purge gas discharged though the first purge gas inlet 8b can accurately flow along the inner wall surface of the first cylindrical tube 8c, and the purge gas discharged though the second purge gas inlet 93 can accurately flow along the outer wall surface of the second cylindrical tube 91c. Thus, the formation of the polycrystal on the portion around the base 9 and on the inner surface of the heating container 8 can be effectively reduced or prevented.

As described above, according to the first embodiment, the purge gas flows to the inner wall surface of the heating container 8 and the outer edge of the base 9. Such a flow of the purge gas reduces or prevents the formation of the polycrystal on the portion around the base 9 and on the inner wall surface of the heating container 8. Thus, clogging of the flow path of the material gas 3 due to the formation of the polycrystal can be avoided. Therefore, it is possible to grow the SiC single crystal 20 for a long time.

Further, the flow of the purge gas reduces or prevents the formation of the polycrystal on the portion around the seed crystal 5. Therefore, even when the SiC single crystal 20 is grown long, it is possible to reduce or prevent adhesion of the polycrystal to the outer edge of the SiC single crystal 20. Therefore, the SiC single crystal 20 can be grown long without loss of quality of the outer edge of the SiC single crystal 20.

Second Embodiment

Figure 6:
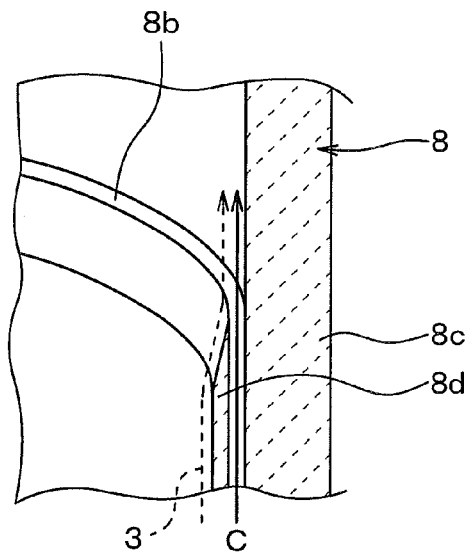
FIG. 6 is a diagram illustrating an enlarged view of a region R3 in FIG. 5.
Figure 7:
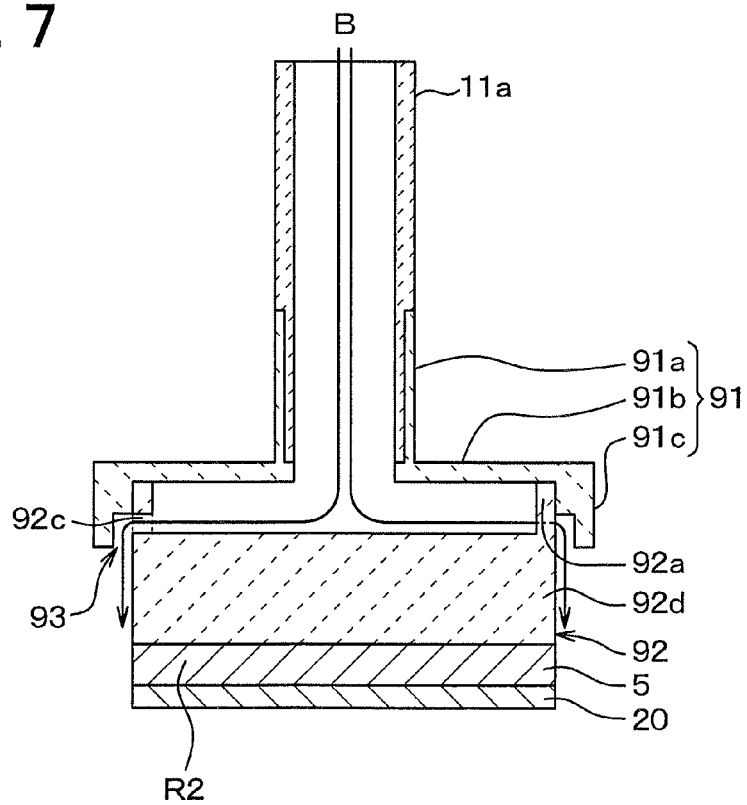
FIG. 7 is a diagram illustrating a partial enlarged view of FIG. 5, showing a base of the SiC single crystal manufacturing apparatus.

A second embodiment of the present invention is described below with reference to FIGS. 5-7. The second embodiment differs from the first embodiment in the shapes of the heating container 8 and the base 9.

Figure 5:
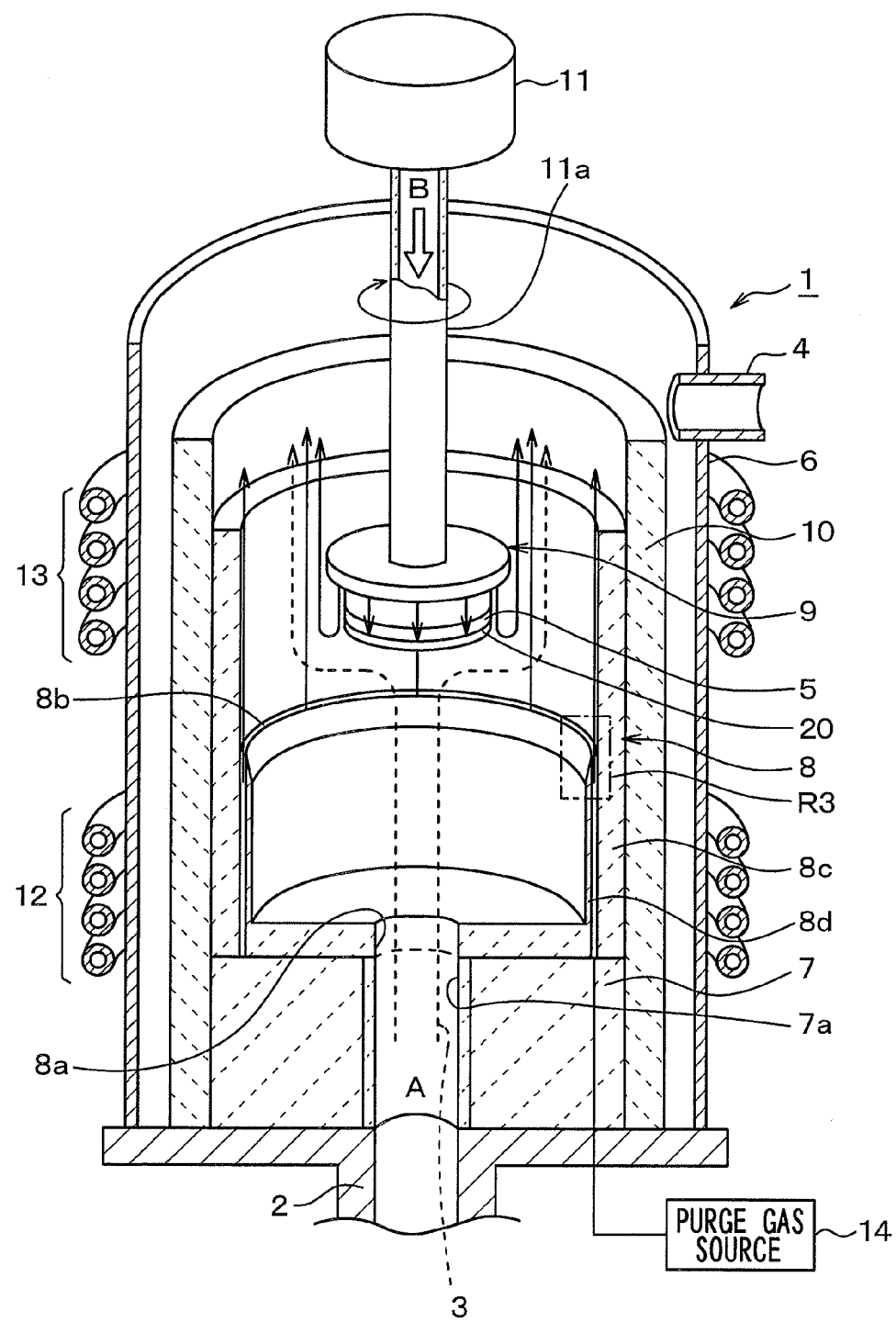
FIG. 5 is a diagram illustrating a perspective cross-sectional view of a SiC single crystal manufacturing apparatus according to a second embodiment of the present invention.

FIG. 5 is a diagram illustrating a perspective cross-sectional view of a SiC single crystal manufacturing apparatus 1 according to the second embodiment of the present invention. FIG. 6 is a diagram illustrating an enlarged view of a region R3 in FIG. 5, showing the heating container 8. FIG. 7 is a diagram illustrating a partial enlarged view of FIG. 5, showing the base 9.

Firstly, the heating container 8 is discussed. As shown in FIGS. 5 and 6, according to the second embodiment, the open end of the second cylindrical tube 8d of the heating container 8 is tapered so that the inner wall surface of the second cylindrical tube 8d can form a predetermined angle θ with the outer wall surface of the second cylindrical tube 8d. Specifically, the inner wall surface of the open end of the second cylindrical tube 8d is tapered (i.e., inclined) to form the angle θ with the outer wall surface of the second cylindrical tube 8d so that the inner diameter of the second cylindrical tube 8d can be increased in the flow direction the material gas 3. The angle θ is not limited to a specific value. Nevertheless, it is preferable that the angle θ be 45 degrees or less.

Since the inner diameter of the open end of the second cylindrical tube 8d is gradually increased, it is less likely that the material gas 3 comes into contact with the inner wall surface of the heating container 8 on the upstream side of the first purge gas inlet 8b in the flow direction of the material gas 3. Thus, it is possible to reduce or prevent adhesion of the polycrystal to the inner wall surface of the heating container 8. In particular, when the angle θ, which is formed by the tapered inner surface of the second cylindrical tube 8d and the outer wall surface of the second cylindrical tube 8d, is 45 degrees or less, it is less likely that the flow of the material gas 3 affects the flow of the purge gas. Therefore, as shown in FIG. 6, the purge gas and the material gas 3 can flow smoothly without interfering with each other.

Next, the base 9 is discussed. As shown in FIG. 7, according to the second embodiment, like the first embodiment, the base 9 includes the coupling portion 91 and the mounting portion 92. However, the coupling portion 91 and the mounting portion 92 of the second embodiment differ in shape from those of the first embodiment.

Specifically, according to the second embodiment, the coupling portion 91 includes the first cylindrical tube 91a, the flange 91b, and the second cylindrical tube 91c. The second cylindrical tube 91c has a stepped portion. That is, the second cylindrical tube 91c has a thicker portion and a thinner portion. The thicker portion is located closer to the flange 91b than the thinner portion. An inner diameter of the thicker portion is less than an inner diameter of the thinner portion. That is, the second cylindrical tube 91c has two different inner diameters. The thinner portion of the second cylindrical tube 91c serves as a ring-shaped guide portion.

The mounting portion 92 includes the cylindrical tube portion 92a with a thick bottom 92d. A tube part of the cylindrical tube portion 92a extends from the bottom 92d in its axis direction, and the communication holes 92c are formed in the tube portion 92a. The outer diameter of the mounting portion 92 is constant. The tube part of the mounting portion 92 is fitted into the thicker portion of the second cylindrical tube 91c. An adhesive is applied between the tube part of the mounting portion 92 and the thicker portion of the second cylindrical tube 91c so that the coupling portion 91 and the mounting portion 92 can be fixed together. Under a condition that the tube part of the mounting portion 92 is fitted into the thicker portion of the second cylindrical tube 91c, the communication holes 92c is spaced from and surrounded by the thinner portion of the second cylindrical tube 91c without being blocked with the thick portion of the second cylindrical tube 91c.

A clearance between the thinner portion of the second cylindrical tube 91c and the tube part of the mounting portion 92 serves as the second purge gas inlet 93. As indicated by an arrow B in FIG. 7, the purge gas is supplied from the pipe member 11a to the outer edge of the base 9 through the purge gas introduction path of the base 9. Then, the supplied purge gas is discharged from the base 9 through the second purge gas inlet 93 in the opposite direction to the flow direction of the material gas 3 so that the discharged purge gas can flow along the outer wall surface of the base 9 (i.e., the cylindrical tube portion 92a).

As described above, according to the second embodiment, the open end of the second cylindrical tube 8d is tapered. In such an approach, it is less likely that the material gas 3 comes into contact with the inner wall surface of the heating container 8 on the upstream side of the first purge gas inlet 8b in the flow direction of the material gas 3. Thus, it is possible to reduce or prevent adhesion of the polycrystal to the inner wall surface of the heating container 8.

Further, the purge gas supplied to the outer edge of the base 9 is discharged through the second purge gas inlet 93 in the opposite direction to the flow direction of the material gas 3. Even in such an approach, the same effect as the first embodiments can be obtained.

Third Embodiment

A third embodiment of the present invention is described below with reference to FIGS. 8 and 9. The third embodiment differs from the first embodiment in the following points.

Figure 8:
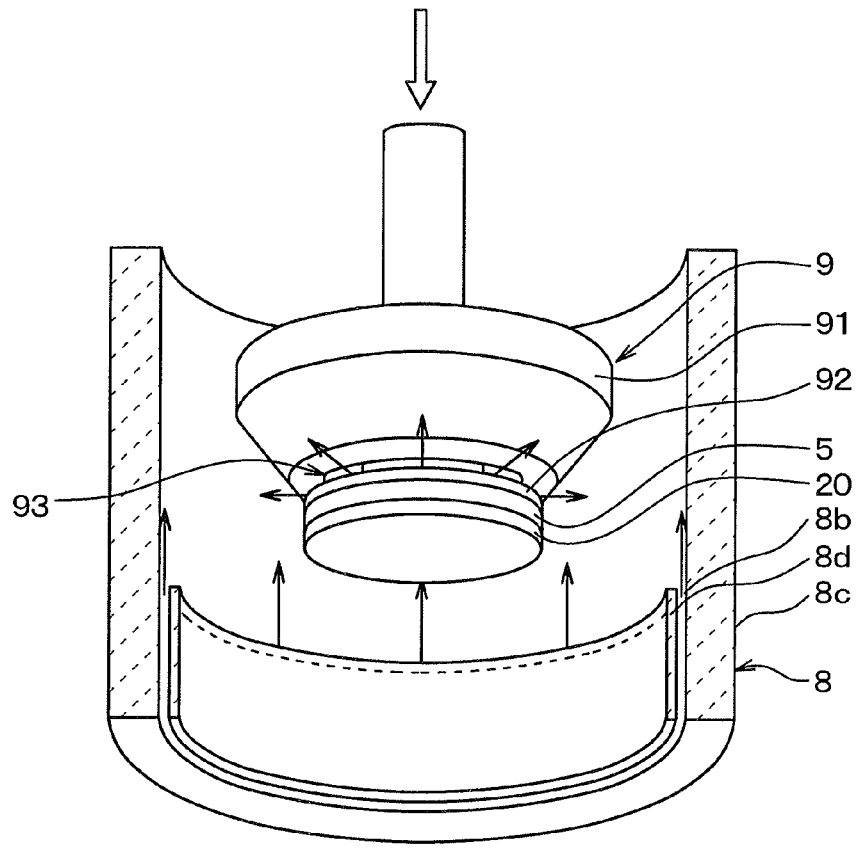
FIG. 8 is a diagram illustrating a perspective cross-sectional view of a base of a SiC single crystal manufacturing apparatus according to a third embodiment of the present invention.
Figure 9:
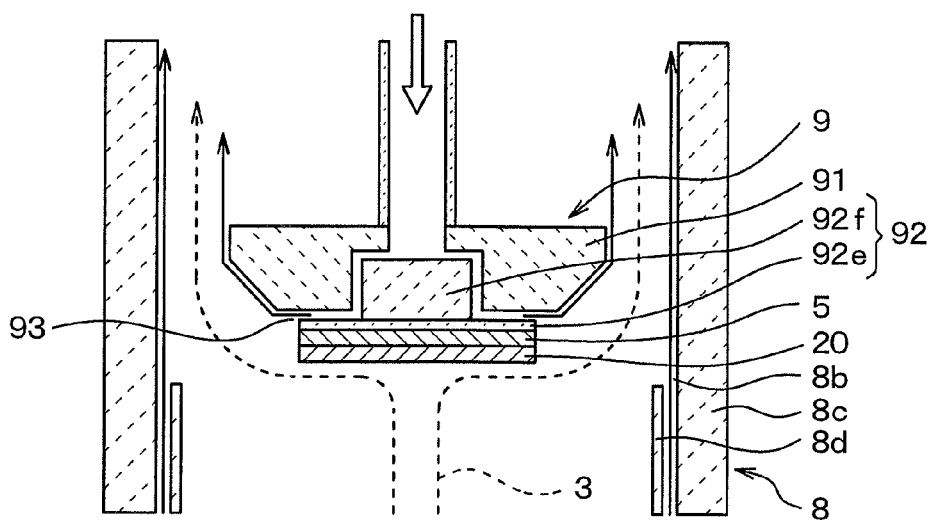
FIG. 9 is a diagram illustrating a cross-sectional view of the base of FIG. 8.

FIG. 8 is a diagram illustrating a perspective cross-sectional view of a base 9 of a SiC single crystal manufacturing apparatus 1 according to the third embodiment, and FIG. 9 is a diagram illustrating a cross-sectional view of the base 9 of FIG. 8. It is noted that FIG. 8 illustrates a bottom side view of the SiC single crystal manufacturing apparatus 1.

As shown in FIGS. 8 and 9, according to the third embodiment, like the first embodiment, the base 9 includes the coupling portion 91 and the mounting portion 92. However, the coupling portion 91 and the mounting portion 92 of the third embodiment differ in shape from those of the first embodiment.

Specifically, the coupling portion 91 has a hollow disc shape. An inner space of the coupling portion 91 has two different diameters. That is, the coupling portion 91 has a thicker portion and a thinner portion. An inner diameter of the thicker portion is less than an inner diameter of the thinner portion. The mounting portion 92 is partially inserted into the thinner portion of the coupling portion 91. An outer wall surface of the thinner portion of the coupling portion 91 is tapered.

The mounting portion 92 includes a circular plate 92e and a solid cylinder 92f. The plate 92e has a first surface and a second surface opposite to the first surface. The first surface of the plate 92e defines the mounting surface where the seed crystal 5 is mounted. The cylinder 92f is located on the second surface of the plate 92e. A lower surface of the coupling portion 91 is parallel to and spaced from the second surface of the plate 92e by a predetermined constant distance (e.g., 5 mm or less). A clearance between the lower surface of the coupling portion 91 and the second surface of the plate 92e serves as the second purge gas inlet 93. Thus, according to the third embodiment, the plate 92e serves as a guide portion for causing the second purge gas inlet 93 to face in the radial outward direction of the base 9. Thus, when the purge gas is discharged through the second purge gas inlet 93, the discharged purge gas flows from the outer edge of the seed crystal 5 in the radial outward direction. Then, the discharged purge gas flows along the lower surface and the tapered surface of the coupling portion 91.

Although not shown in the drawings, the coupling portion 91 and the mounting portion 92 are fixed together, for example, by projections that are formed on the inner surface of the coupling portion 91 or on the outer surface of the cylinder 92f of the mounting portion 92. In this case, the purge gas flows to the second purge gas inlet 93 through between the projections.

As described above, according to the third embodiment, the second purge gas inlet 93 faces in the radial outward direction so that the purge gas can be discharged from the outer edge of the seed crystal 5 in the radial outward direction. Since the purge gas is discharged from near the mounting surface where the seed crystal 5 is mounted, it is possible to prevent or reduce adhesion of the polycrystal on the near side of the base 9 from the seed crystal 5.

Further, according to the third embodiment, the outer wall surface of the coupling portion 91 is tapered. In such an approach, the material gas 3 and the discharged purge gas can smoothly flow along the outer wall surface of the coupling portion 91.

Fourth Embodiment

A fourth embodiment of the present invention is described below with reference to FIGS. 10 and 11. The fourth embodiment differs from the first embodiment in the shapes of the heating container 8 and the base 9.

Figure 10:
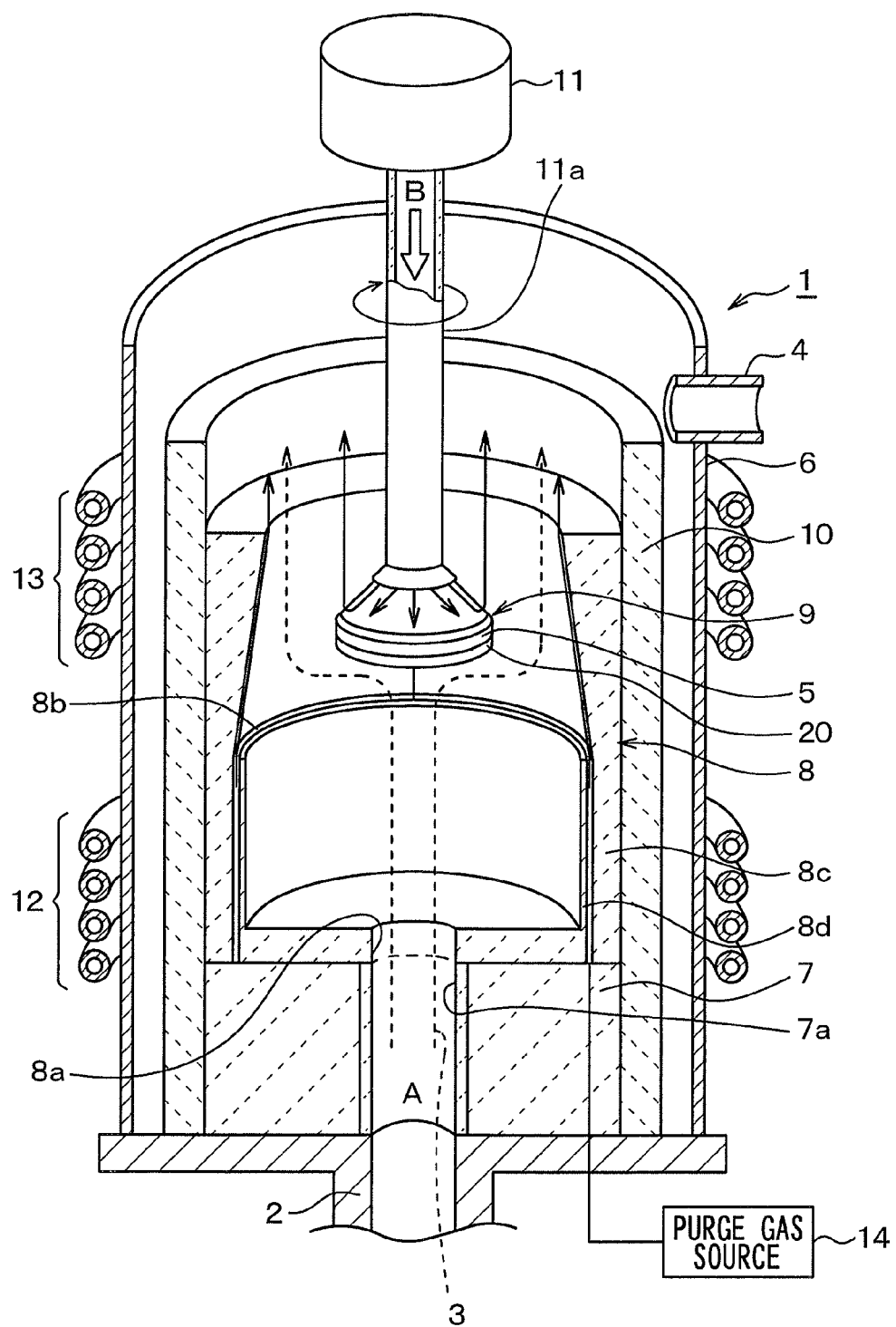
FIG. 10 is a diagram illustrating a perspective cross-sectional view of a SiC single crystal manufacturing apparatus according to a fourth embodiment of the present invention.
Figure 11:
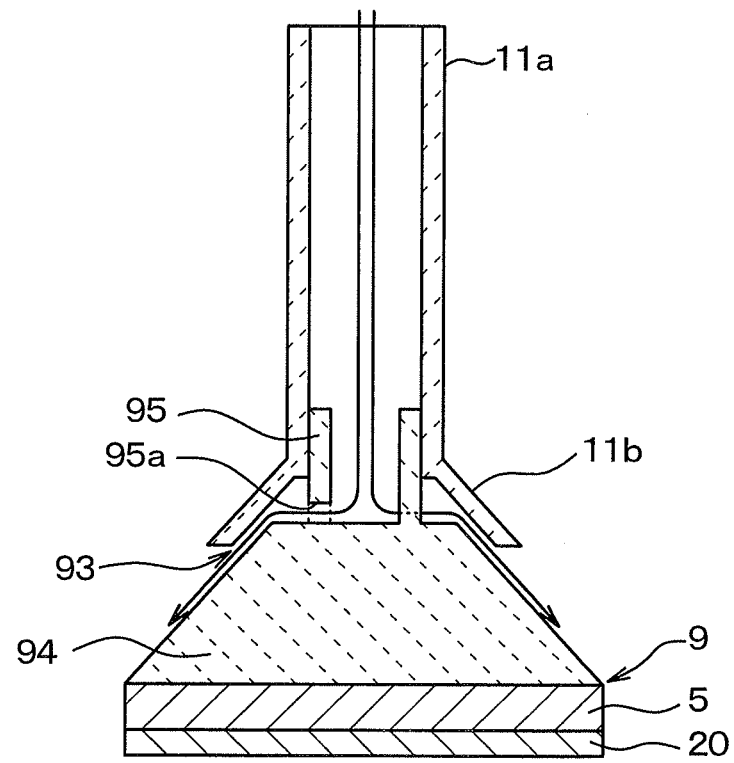
FIG. 11 is a diagram illustrating a partial enlarged view of FIG. 10, showing a base of the SiC single crystal manufacturing apparatus.

FIG. 10 is a diagram illustrating a perspective cross-sectional view of a SiC single crystal manufacturing apparatus 1 according to the fourth embodiment. FIG. 11 is a diagram illustrating a partial enlarged view of FIG. 10, showing the base 9.

Firstly, the heating container 8 is discussed. As shown in FIG. 10, according to the fourth embodiment, the inner wall surface of the heating container 8 is tapered so that the inner diameter of the heating container 8 can be reduced in the flow direction the material gas 3. Specifically, the inner diameter of the first cylindrical tube 8c is gradually reduced on the downstream side of the first purge gas inlet 8b in the flow direction of the material gas 3. More specifically, the first cylindrical tube 8c has a first tube part and a second tube part communicating with the first part. An inner diameter of the first tube part of the first cylindrical tube 8c is gradually reduced in the flow direction of the material gas 3. The first tube part of the first cylindrical tube 8c is located on the downstream side of the second tube part of the first cylindrical tube 8c in the flow direction of the material gas 3. Further, the first tube part of the first cylindrical tube 8c is located on the downstream side of the first purge gas inlet 8b in the flow direction of the material gas 3.

Next, the base 9 is discussed. As shown in FIG. 11, the base 9 includes a frustum 94 and a cylindrical tube 95. The frustum 94 has a top surface and a bottom surface larger in area than the top surface. The seed crystal 5 is mounted on the bottom surface of the frustum 94. That is, the bottom surface of the frustum 94 defines the mounting surface. The tube 95 extends perpendicularly from the top surface of the frustum 94. The tube 95 is inserted into an end portion of the pipe member 11a so that the tube 95 and the pipe member 11a can communicate with each other. Communication holes 95a are formed in the tube 95 and arranged at a regular interval in a circumferential direction of the tube 95. The purge gas introduced through the pipe member 11a is discharged through the communication holes 95a.

The end portion of the pipe member 11a spreads toward the end to form a ring-shaped guide portion 11b. The guide portion 11b extends parallel to an outer wall surface (side wall surface) of the frustum 94. Thus, under a condition where the tube 95 is inserted into the end portion of the pipe member 11a, the outer wall surface of the frustum 94 is parallel to and spaced from an inner wall surface of the guide portion 11b. A clearance between the outer wall surface of the frustum 94 and the inner wall surface of the guide portion 11b serves as the second purge gas inlet 93.

According to the fourth embodiment of the present invention, the purge gas that is discharged through the first purge gas inlet 8b of the heating container 8 flows along the inner wall surface of the heating container 8 in the same direction as the flow direction of the material gas 3. Further, the purge gas that is discharged through the second purge gas inlet 93 of the base 9 flows along the outer wall surface of the base 9 in the opposite direction to the flow direction of the material gas 3. The inner diameter of the heating container 8 is reduced in the flow direction of the purge gas that is discharged through the first purge gas inlet 8b, and the outer diameter of the base 9 is increased in the flow direction of the purge gas that is discharged through the second purge gas inlet 93. Thus, the purge gas effectively flows along the inner wall surface of the heating container 8 and the outer wall surface of the base 9 so that the formation of the polycrystal can be effectively reduced or prevented.

According to the fourth embodiment, it is likely that the purge gas hits against the inner wall surface of the heating container 8 and the outer wall surface of the base 9. Therefore, it is preferable that the surfaces of the heating container 8 and the base 9 be coated with a refractory metal carbide such as tantalum carbide (TaC) or niobium carbide (NbC) to reduce or prevent thermal etching of the heating container 8 and the base 9.

Fifth Embodiment

A fifth embodiment of the present invention is described below with reference to FIGS. 12 and 13. The fifth embodiment differs from the first embodiment in the shape of the base 9.

Figure 12:
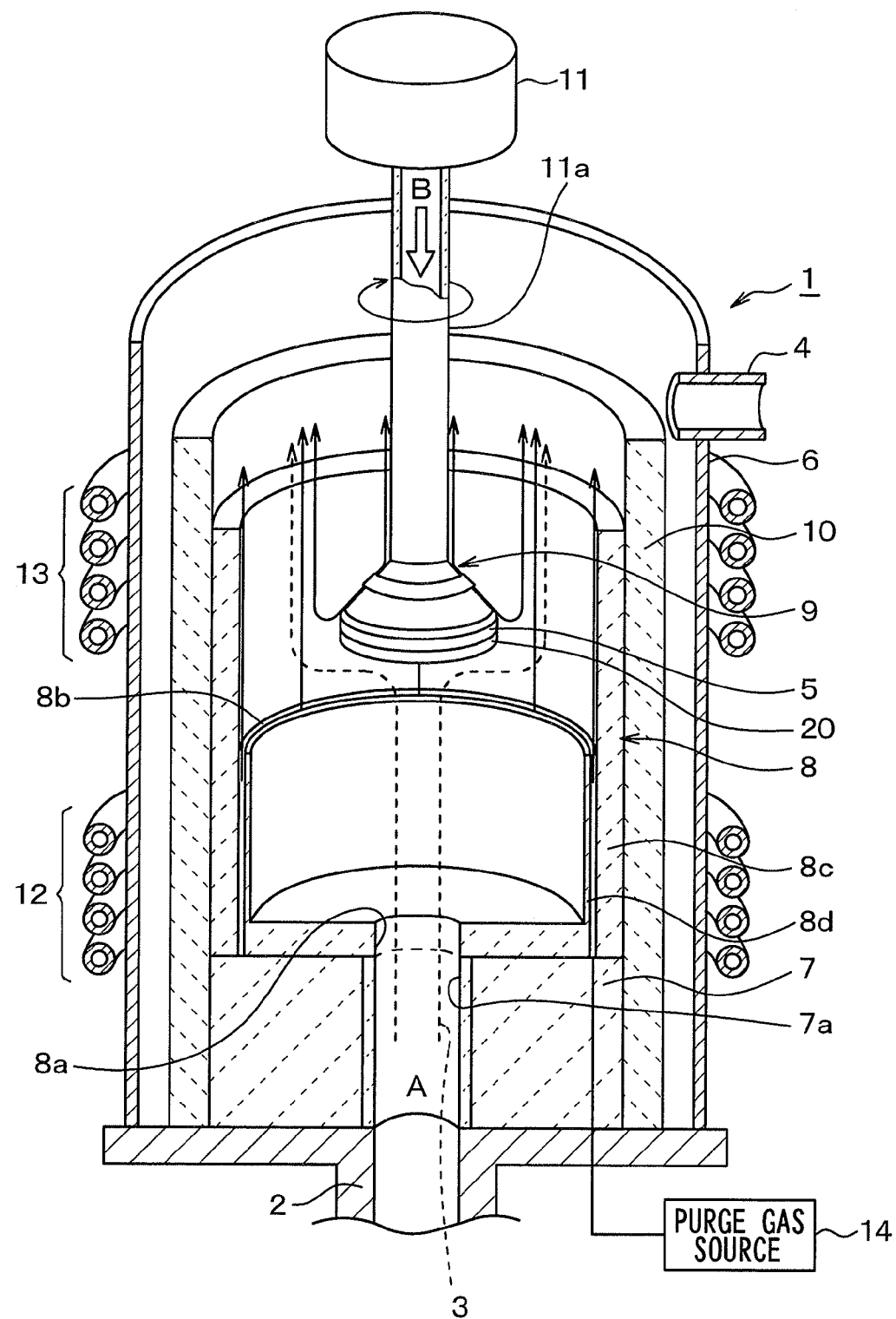
FIG. 12 is a diagram illustrating a perspective cross-sectional view of a SiC single crystal manufacturing apparatus according to a fifth embodiment of the present invention.

FIG. 12 is a diagram illustrating a perspective cross-sectional view of a SiC single crystal manufacturing apparatus 1 according to the fifth embodiment. FIG. 13 is a diagram illustrating a partial enlarged view of FIG. 12, showing the base 9.

Figure 13:
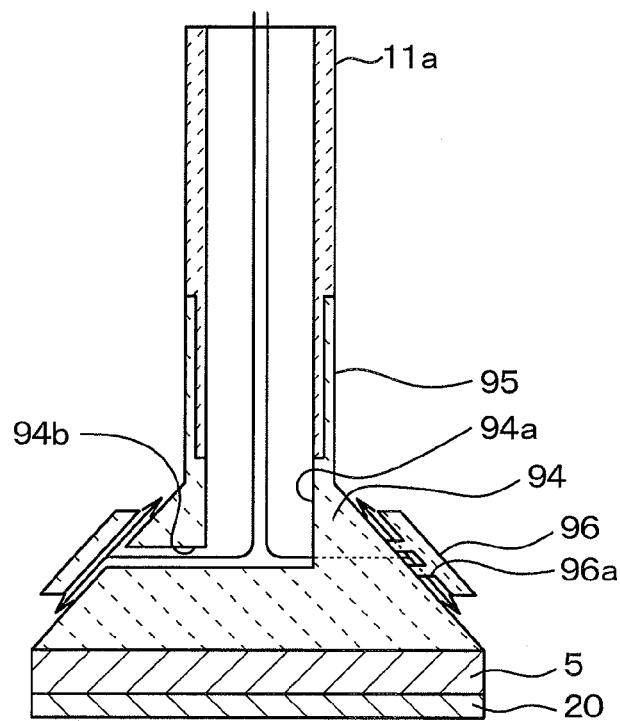
FIG. 13 is a diagram illustrating a partial enlarged view of FIG. 12, showing a base of the SiC single crystal manufacturing apparatus.

As shown in FIGS. 12 and 13, according to the fifth embodiment, the base 9 includes a frustum 94, a cylindrical tube 95, and a guide portion 96. The frustum 94 has a top surface and a bottom surface larger in area than the top surface. The seed crystal 5 is mounted on the bottom surface of the frustum 94. That is, the bottom surface of the frustum 94 defines the mounting surface. The tube 95 extends perpendicularly from the top surface of the frustum 94. The tube 95 is engaged with an end portion of the pipe member 11a so that the tube 95 and the pipe member 11a can communicate with each other. The guide portion 96 is located around the frustum 94.

The top surface of the frustum 94 is recessed to form a recess 94a. The recess 94a communicates with the pipe member 11a. Further, communication holes 94b are formed in an inner wall surface of the recess 94a. The communication holes 94b are located closer to a bottom of the recess 94a than an opening of the recess 94a. The communication holes 94b are arranged at a regular interval in a circumferential direction of the recess 94a. The purge gas introduced through the pipe member 11a is discharged through the communication holes 94b.

The guide portion 96 has a hollow frustum shape spreading toward the end. Specifically, the guide portion 96 extends parallel to an outer wall surface (side wall surface) of the frustum 94. Multiple supporting potions 96a project from an inner wall surface of the guide portion 96 and support the guide portion 96 on the outer wall surface of the frustum 94. Each supporting portion 96a has a predetermined length. Thus, the outer wall surface of the frustum 94 is parallel to and spaced from the inner wall surface of the guide portion 96. A clearance between the outer wall surface of the frustum 94 and the inner wall surface of the guide portion 96 serves as the second purge gas inlet 93. That is, the guide portion 96 covers the communication holes 94b of the frustum 94 so that the purge gas discharged through the communication holes 94b can flow not only in the same direction as the flow direction of the material gas 3 but also in the opposite direction to the flow direction of the material gas 3.

As described above, according to the fifth embodiment of the present invention, the base 9 has the guide portion 96 for causing the second purge gas inlet 93 to face not only toward the seed crystal 5 but also toward the pipe member 11a. In such an approach, the purge gas can be discharged not only in the same direction as the flow direction of the material gas 3 but also in the opposite direction to the flow direction of the material gas 3. Thus, it is possible to effectively reduce or prevent the formation of the polycrystal on the outer wall surface of the base 9.

MODIFICATIONS

The embodiments can be modified in various ways, for example, as follows.

In the embodiments, the first purge gas inlet 8b extends circularly along the inner wall surface of the heating container 8 in a circumferential direction of the heating container 8. That is, the first purge gas inlet 8b has a closed circle shape along the entire inner circumferential surface of the heating container 8. In such an approach, the flow of the purge gas around the base 9 becomes uniform so that the formation of the polycrystal can be effectively reduced or prevented. However, the shape of the first purge gas inlet 8*b* is not limited to such a closed circle along the inner wall surface of the heating container 8. For example, the heating container 8 can be a circular tube having a thicker portion defining a first diameter and a thinner portion defining a second diameter larger than the first diameter. The thinner portion is located on the downstream side of the thicker portion in the flow direction of the material gas 3. In this case, a ring-shape guide portion having a third inner diameter less than the first diameter is placed at an interface between the thicker portion and the thinner portion to from a clearance, as the first purge gas inlet 8*b*, between the guide portion and the thinner portion. Then, communication holes are formed in a bottom of the clearance and arranged in a regular interval in the circumferential direction of the heating container 8.

In the second embodiment, the open end of the second cylindrical tube 8*d* is tapered so that the inner diameter of the second cylindrical tube 8*d* can be increased in the flow direction of the material gas 3. Such a structure as discussed in the second embodiment can be applied to the first, third, fourth, and fifth embodiments.

Figures 14A, 14B:
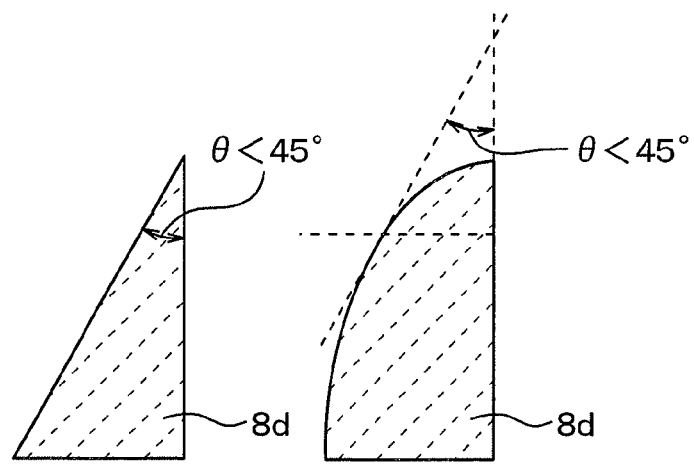
FIG. 14A is a diagram illustrating a modification of the second embodiment.
FIG. 14B is a diagram illustrating another modification of the second embodiment.

The open end of the second cylindrical tube 8*d* can have a shape other a tapered shape, as long as the inner diameter of the open end of the second cylindrical tube 8*d* can be increased in the flow direction of the material gas 3. For example, the open end of the second cylindrical tube 8*d* can have a triangle shape, a large-diameter shape, an ellipsoidal shape, or a sectorial shape. In these cases, as shown in FIG. 14A, it is preferable that the inner wall surface of the open end of the second cylindrical tube 8*d* form an angle θ of 45 degrees or less with the outer wall surface of the second cylindrical tube 8*d*. As shown in FIG. 14B, when the open end of the second cylindrical tube 8*d* has a sectorial shape, the angle θ can be defined as an angle between a tangent line to the rounded inner wall surface of the open end of the second cylindrical tube 8*d* and the outer wall surface of the second cylindrical tube 8*d*.

In the fifth embodiment, the second purge gas inlet 93 of the base 9 allows the purge gas to be discharged in two directions. Alternatively, the purge gas can be discharged in more than two directions. For example, three or more second purge gas inlets 93 can be provided to the base 9. In this case, for example, the second purge gas inlet 93 of the first embodiment and the second purge gas inlet 93 of the fifth embodiment can be combined so that the purge gas can be discharged in three directions.

In the embodiments, the purge gas is discharged through the first purge gas inlet 8*b* on the inner wall surface of the heating container 8 in the same direction as the flow direction of the material gas 3. Alternatively, the first purge gas inlet 8*b* is pointed downward so that the purge gas can be discharged through the first purge gas inlet 8*b* in the opposite direction to the flow direction of the material gas 3. The heating container 8 can be provided with multiple first purge gas inlets 8*b*.

Such changes and modifications are to be understood as being within the scope of the present invention as defined by the appended claims.

What is claimed is:

1. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:
   a cylindrical tube-shaped heating container defining a reaction chamber for growing the silicon carbide single crystal;
   a disk-shaped base located in the reaction chamber of the heating container and having a first side and a second side opposite to the first side, the seed crystal mounted on the first side of the base;
   a first purge gas inlet provided to an inner wall of the heating container to cause a purge gas to flow along a surface of the inner wall of the heating container;
   a purge gas source for supplying the purge gas to the first purge gas inlet;
   a second purge gas inlet provided to an outer wall of the base to cause the purge gas to flow along a surface of the outer wall of the base;
   a purge gas introduction mechanism for supporting the base and for supplying the purge gas to the base from the second side of the base, and
   a ring-shaped first guide portion spaced from the surface of the outer wall of the base to form the second purge gas inlet therebetween, wherein
   the heating container includes a cylindrical tube portion and a ring-shaped second guide portion spaced from a surface of an inner wall of the tube portion to form the first purge gas inlet therebetween.

2. The apparatus according to claim 1, wherein
   the first purge gas inlet extends circularly along the inner wall surface of the heating container in a circumferential direction of the heating container.

3. The apparatus according to claim 1, wherein
   the second guide portion is spaced from the tube portion by a predetermined constant distance, and
   a surface of an outer wall of the tube portion is parallel to a surface of an inner wall of the second guide portion.

4. The apparatus according to claim 1, wherein
   an inner diameter of the second guide portion is increased in a flow direction of the material gas.

5. The apparatus according to claim 4, wherein
   the surface of the inner wall of the second guide portion is tapered so that the inner diameter of the second guide portion is increased in the flow direction of the material gas, and
   the surface of the inner wall of the second guide portion and the surface of an outer wall of the second guide portion form an angle of 45 degrees or less.

6. The apparatus according to claim 1, wherein
   an inner diameter of the tube portion of the heating container is gradually reduced on the downstream side of the first purge gas inlet in a flow direction of the material gas.

7. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:
   a cylindrical tube-shaped heating container defining a reaction chamber for growing the silicon carbide single crystal;
   a disk-shaped base located in the reaction chamber of the heating container and having a first side and a second side opposite to the first side, the seed crystal mounted on the first side of the base;
   a first purge gas inlet provided to an inner wall of the heating container to cause a purge gas to flow along a surface of the inner wall of the heating container;
   a purge gas source for supplying the purge gas to the first purge gas inlet;
   a second purge gas inlet provided to an outer wall of the base to cause the purge gas to flow along a surface of the outer wall of the base;

a purge gas introduction mechanism for supporting the base and for supplying the purge gas to the base from the second side of the base, and a ring-shaped first guide portion spaced from the surface of the outer wall of the base to form the second purge gas inlet therebetween, wherein the heating container is provided with a plurality of first purge gas inlets including the first purge gas inlet.

8. The apparatus according to claim 1, wherein the heating container is coated with a refractory metal carbide.

9. The apparatus according to claim 1, wherein
the first guide portion is spaced from the surface of the outer wall of the base by a predetermined constant distance, and a surface of an inner wall of the first guide portion is parallel to the surface of the outer wall of the base.

10. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:

a cylindrical tube-shaped heating container defining a reaction chamber for growing the silicon carbide single crystal;

a disk-shaped base located in the reaction chamber of the heating container and having a first side and a second side opposite to the first side, the seed crystal mounted on the first side of the base;

a first purge gas inlet provided to an inner wall of the heating container to cause a purge gas to flow along a surface of the inner wall of the heating container;

a purge gas source for supplying the purge gas to the first purge gas inlet;

a second purge gas inlet provided to an outer wall of the base to cause the purge gas to flow along a surface of the outer wall of the base;

a purge gas introduction mechanism for supporting the base and for supplying the purge gas to the base from the second side of the base, and a ring-shaped first guide portion spaced from the surface of the outer wall of the base to form the second purge gas inlet therebetween, wherein the purge gas introduction mechanism has a pipe member through which the purge gas is supplied to the base, the base includes a coupling portion coupled to the pipe member and a mounting portion having a mounting surface where the seed crystal is mounded, the coupling portion includes a cylindrical tube portion fitted with the mounting portion, a surface of an outer wall of the tube portion of the coupling portion defines the surface of the outer wall of the base, the mounting portion has the first guide portion, the first guide portion projects perpendicularly to the mounting surface in such a manner that a surface of an inner wall of the first guide portion faces and is spaced from the surface of the outer wall of the tube portion to form the second purge gas inlet therebetween, and the purge gas that is discharged through the second purge gas inlet flows along the surface of the outer wall of the tube portion in the same direction as a flow direction of the material gas.

11. The apparatus according to claim 10, wherein
an outer diameter of the first guide portion is reduced in the flow direction of the material gas.

12. The apparatus according to claim 1, wherein
the purge gas introduction mechanism has a pipe member through which the purge gas is supplied to the base, the base includes a coupling portion coupled to the pipe member and a mounting portion having a mounting surface where the seed crystal is mounded, the coupling portion includes a cylindrical tube portion fitted with the mounting portion, the tube portion of the coupling portion has a part where an inner diameter of the tube portion is enlarged, the mounting portion has a cylindrical tube with a bottom portion that closes a first end of the tube, a second end of the tube of the mounting portion is fitted into the tube portion of the coupling portion so that the coupling portion and the mounting portion are connected together, an inner wall surface of the part of the tube portion of the coupling portion is spaced from an outer wall surface of the tube of the mounting portion to form the second purge gas inlet therebetween, and the second purge gas inlet is configured in such a manner that the purge gas that is discharged through the second purge gas inlet flows along the outer wall surface of the tube of the mounting portion in an opposite direction to a flow direction of the material gas.

13. The apparatus according to claim 1, wherein
the purge gas introduction mechanism has a pipe member through which the purge gas is supplied to the base, the base includes a coupling portion coupled to the pipe member and a mounting portion having a mounting surface where the seed crystal is mounded, the coupling portion has a hollow disc shape with an inner space, the mounting portion includes a circular plate and a solid cylinder, the circular plate has a first side defining the mounting surface where the seed crystal is mounted and a second side opposite to the first side of the circular plate, the solid cylinder of the mounting portion is located on the second side of the circular plate and fitted into the inner space of the coupling portion so that the coupling portion and the mounting portion are connected together, the circular plate of the mounting portion is spaced from the coupling portion to form the second purge gas inlet therebetween, and the second purge gas inlet is configured in such a manner that the purge gas is discharged through the second purge gas inlet from an outer edge of the seed crystal in a radial outward direction and that the discharged purge gas flows along an outer wall surface of the coupling portion.

14. The apparatus according to claim 1, wherein
the purge gas introduction mechanism has a pipe member through which the purge gas is supplied to the base, the base includes a frustum and a cylindrical tube, the frustum has a top surface and a bottom surface defining a mounting surface where the seed crystal is mounted, the tube of the base projects perpendicularly from the top surface of the frustum and is fitted into an end of the pipe member, the first guide portion is provided to the end of the pipe member, and an inner diameter of the first guide portion is increased with a distance from the end of the pipe member, the frustum is spaced from the first guide portion to form the second purge gas inlet therebetween, and the second purge gas inlet is configured in such a manner that the purge gas that is discharged through the second purge gas inlet flows along an outer wall surface of the frustum in an opposite direction to a flow direction of the material gas.

15. The apparatus according to claim 1, wherein the purge gas introduction mechanism has a pipe member through which the purge gas is supplied to the base, the base includes a hollow frustum-shaped guide portion, a frustum, and a cylindrical tube, the frustum has a top surface and a bottom surface defining a mounting surface where the seed crystal is mounted, the tube of the base projects perpendicularly from the top surface of the frustum and is fitted with the pipe member, the frustum-shaped guide portion is located facing an outer wall surface of the frustum the frustum-shaped guide portion is spaced from the frustum to form the second purge gas inlet therebetween, the top surface of the frustum is recessed to form a recess, the recess communicates with the pipe member, an inner wall surface of the recess is provided with communication holes that are arranged at a regular interval in a circumferential direction of the recess, the frustum-shaped guide portion covers the communication holes to change a direction of flow of the purge gas that is discharged through the communication holes, and the second purge gas inlet is configured in such a manner that the purge gas that is discharged through the second purge gas inlet flows not only in the same direction as a flow direction of the material gas but also in an opposite direction to the flow direction of the material gas.

\* \* \* \* \*